(12) United States Patent
Chen et al.

(10) Patent No.: US 12,219,333 B2
(45) Date of Patent: *Feb. 4, 2025

(54) METHOD OF MANUFACTURING ACOUSTIC DEVICES WITH IMPROVED SENSITIVITY

(71) Applicant: Skyworks Solutions, Inc., Irvine, CA (US)

(72) Inventors: Guofeng Chen, Fremont, CA (US); Michael Jon Wurtz, Lake Oswego, OR (US); Rakesh Kumar, Singapore (SG); You Qian, Singapore (SG); Humberto Campanella-Pineda, Singapore (SG)

(73) Assignee: Skyworks Solutions, Inc., Irvine, CA (US)

( * ) Notice: Subject to any disclaimer, the term of this patent is extended or adjusted under 35 U.S.C. 154(b) by 225 days.

This patent is subject to a terminal disclaimer.

(21) Appl. No.: 17/664,023

(22) Filed: May 18, 2022

(65) Prior Publication Data

US 2022/0408208 A1    Dec. 22, 2022

Related U.S. Application Data

(60) Provisional application No. 63/202,596, filed on Jun. 17, 2021, provisional application No. 63/202,599, filed on Jun. 17, 2021.

(51) Int. Cl.
*H04R 31/00* (2006.01)
*B81B 3/00* (2006.01)
(Continued)

(52) U.S. Cl.
CPC ......... *H04R 31/006* (2013.01); *B81B 3/0021* (2013.01); *H04R 3/00* (2013.01);
(Continued)

(58) Field of Classification Search
CPC ........ H04R 31/006; H04R 3/00; H04R 17/02; H04R 2201/003; H10N 30/302; H10N 30/306; H10N 30/872; H10N 30/05
See application file for complete search history.

(56) References Cited

U.S. PATENT DOCUMENTS 9,029,963 B2    5/2015   Sparks et al.
9,055,372 B2    6/2015   Grosh et al.
(Continued)

FOREIGN PATENT DOCUMENTS

CN       11602616      12/2019
JP       2010232971 A  10/2010
(Continued)

*Primary Examiner* — David L Ton
(74) *Attorney, Agent, or Firm* — Knobbe, Martens, Olson & Bear LLP

(57) ABSTRACT

A method of making an acoustic sensor (e.g., a piezoelectric sensor for a piezoelectric microelectromechanical systems microphone) includes forming or depositing one or more piezoelectric layers to define a beam extending between a proximal portion and a distal tip (e.g., unsupported free end), the beam having a width in plan view that is greater at a location distal of the proximal portion than at the proximal portion. The method also comprises attaching the beam to a substrate in cantilever form so that the proximal portion of the beam is anchored to the substrate and the distal tip is a free unsupported end of the beam. One or more electrodes are disposed on or in the proximal portion of the beam.

20 Claims, 13 Drawing Sheets

(51) Int. Cl.
  *H04R 3/00* (2006.01)
  *H04R 17/02* (2006.01)
  *H10N 30/05* (2023.01)
  *H10N 30/30* (2023.01)
  *H10N 30/50* (2023.01)
  *H10N 30/87* (2023.01)

(52) U.S. Cl.
  CPC ............ *H04R 17/02* (2013.01); *H10N 30/05* (2023.02); *H10N 30/302* (2023.02); *H10N 30/306* (2023.02); *H10N 30/50* (2023.02); *H10N 30/872* (2023.02); *B81B 2201/0257* (2013.01); *H04R 2201/003* (2013.01)

(56) References Cited

U.S. PATENT DOCUMENTS

| | | | |
|---|---|---|---|
| 10,710,874 | B2 | 7/2020 | Frischmuth et al. |
| 11,212,617 | B2 | 12/2021 | Duan et al. |
| 11,212,623 | B2 | 12/2021 | Duan et al. |
| 11,265,657 | B2 | 3/2022 | Duan et al. |
| 11,902,740 | B2 | 2/2024 | Sun et al. |
| 11,924,610 | B2 * | 3/2024 | Rusconi Clerici Beltrami ........... H04R 31/003 |
| 2006/0230835 | A1 | 10/2006 | Wang |
| 2009/0301196 | A1 | 12/2009 | Wang |
| 2011/0124124 | A1 | 5/2011 | Shih |
| 2014/0363025 | A1 | 12/2014 | Stetson et al. |
| 2015/0350772 | A1 | 12/2015 | Oliaei et al. |
| 2016/0249122 | A1 | 8/2016 | Popper |
| 2017/0318385 | A1 | 11/2017 | Harney |
| 2018/0077497 | A1 | 3/2018 | Hatipoglu |
| 2018/0186623 | A1 | 7/2018 | Vossough |
| 2019/0289405 | A1 | 9/2019 | Littrell |
| 2019/0327562 | A1 | 10/2019 | Cerini |
| 2021/0051414 | A1 * | 2/2021 | Duan .................... H04R 17/02 |
| 2022/0073342 | A1 | 3/2022 | Ho |
| 2022/0166403 | A1 | 5/2022 | Doll |
| 2022/0402751 | A1 * | 12/2022 | Chen .................... H10N 30/306 |
| 2022/0408185 | A1 | 12/2022 | Barsukou |
| 2022/0408195 | A1 * | 12/2022 | Barsukou ................. H04R 3/02 |

FOREIGN PATENT DOCUMENTS

| | | |
|---|---|---|
| WO | WO 2021/036653 | 3/2021 |
| WO | WO 2021098562 A1 | 5/2021 |

* cited by examiner

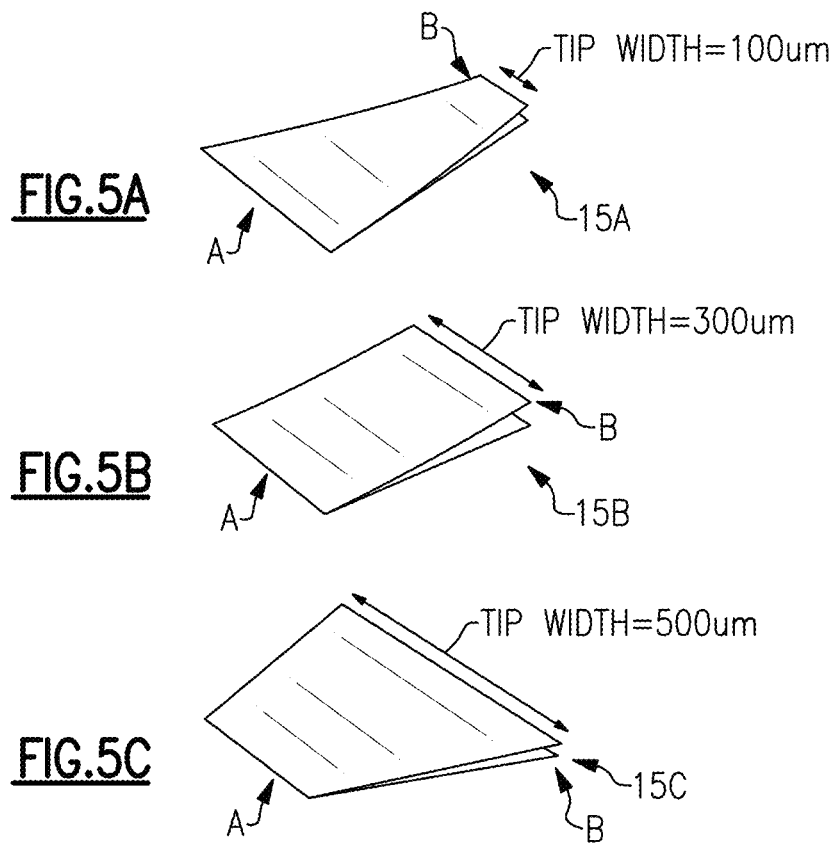
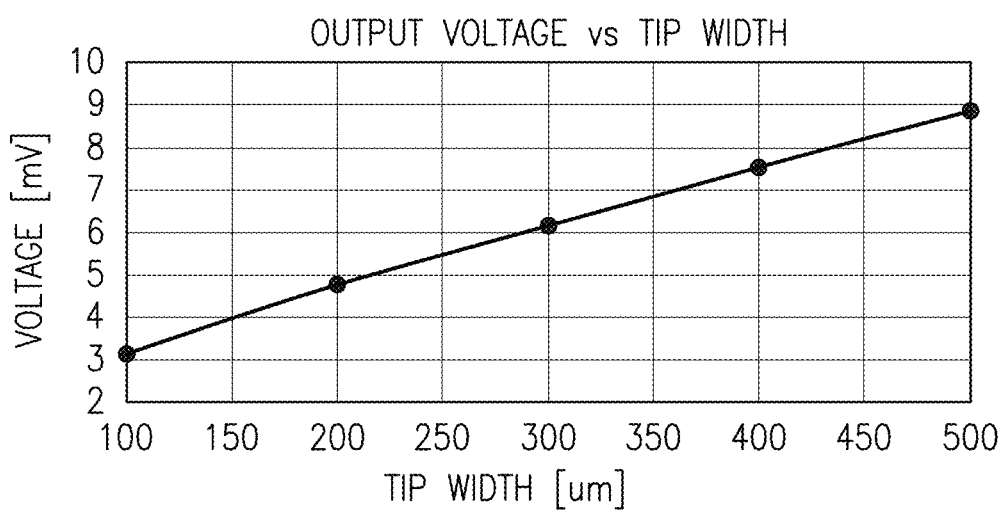
FIG.6

METHOD OF MANUFACTURING ACOUSTIC DEVICES WITH IMPROVED SENSITIVITY

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present disclosure is directed to acoustic devices, such as piezoelectric microelectromechanical systems (MEMS) microphones, and in particular to methods of manufacturing acoustic devices with sensitivity improvement due to widened cantilever tip.

Description of the Related Art

A MEMS microphone is a micro-machined electromechanical device used to convert sound pressure (e.g., voice sound) to an electrical signal (e.g., voltage). MEMS microphones are widely used in mobile devices, headsets, smart speakers and other voice-interface devices or systems. Conventional capacitive MEMS microphones suffer from high power consumption (e.g., large bias voltage) and reliability, for example when used in a harsh environment (e.g., when exposed to dust and/or water).

Piezoelectric MEMS microphones have been used to address the deficiencies of capacitive MEMS microphones. Piezoelectric MEMS microphones offer a constant listening capability while consuming almost no power (e.g., no bias voltage is needed), are robust and immune to water and dust contamination. Existing piezoelectric MEMS microphones include cantilever MEMS structures, and are mostly based on sputter-deposited thin film piezoelectric structure.

SUMMARY

Accordingly, there is a need for an acoustic device with improved sensitivity, for example, a piezoelectric MEMS microphone with higher output energy and/or smaller size than existing MEMS microphones.

In accordance with one aspect of the disclosure, a cantilevered sensor is provided for use in piezoelectric MEMS microphones. The cantilevered sensor has a beam with a proximal portion anchored to a substrate and that extends to a distal tip at a free (e.g., unsupported) end. A width of the beam (e.g., in plan view) is greater at a location distal of the proximal portion than at the proximal portion. The cantilevered sensors advantageously provide increased performance (e.g., increased output energy) for the same device area as a conventional cantilevered sensor. In one example, a width of the beam (e.g., in plan view) is greater at the distal tip than at the proximal portion.

In accordance with one aspect of the disclosure, a cantilevered sensor is provided for use in piezoelectric MEMS microphones. The cantilevered sensor has a beam with a proximal portion anchored to a substrate and that extends to a distal tip at a free (e.g., unsupported) end. A width of the beam (e.g., in plan view) is greater at a location distal of the proximal portion than at the proximal portion. The cantilevered sensors advantageously provide the same performance (e.g., output energy) as a conventional cantilevered sensor in a smaller device area, allowing for the reduction in size of the piezoelectric MEMS microphone. In one example, a width of the beam (e.g., in plan view) is greater at the distal tip than at the proximal portion.

In accordance with one aspect of the disclosure, an acoustic sensor (e.g., for use in a piezoelectric MEMS microphone) is provided that includes a substrate and a cantilever beam attached to the substrate. The cantilever beam has a proximal portion attached to the substrate and extending to a distal tip at a free end of the beam. The cantilevered beam has a width in plan view that is greater at a location distal of the proximal portion than at the proximal portion attached to the substrate. One or more electrodes are disposed on or in the proximal portion of the beam.

In accordance with another aspect of the disclosure, a piezoelectric sensor for a piezoelectric MEMS microphone is provided. The sensor comprises a substrate and a cantilever beam. The cantilever beam has a proximal portion attached to the substrate and extending to a distal tip at a free end of the beam. The cantilevered beam has a width in plan view that is greater at a location distal of the proximal portion than at the proximal portion attached to the substrate. One or more electrodes are disposed on or in the proximal portion of the beam.

In accordance with another aspect of the disclosure, a piezoelectric MEMS microphone is provided. The microphone comprises a substrate and a plurality of piezoelectric sensors movably coupled to the substrate. Each of the piezoelectric sensors is spaced apart from an adjacent piezoelectric sensor by a gap. Each piezoelectric sensor includes a cantilever beam having a proximal portion attached to the substrate and extending to a distal tip at a free end of the beam. The cantilevered beam has a width in plan view that is greater at a location distal of the proximal portion than at the proximal portion attached to the substrate. One or more electrodes are disposed on or in the proximal portion of the beam.

In accordance with another aspect of the disclosure, an audio subsystem is provided. The audio subsystem comprises an audio codec and one or more piezoelectric MEMS microphones in communication with the audio codec. Each microphone includes a substrate and a plurality of piezoelectric sensors movably coupled to the substrate. Each of the piezoelectric sensors is spaced apart from an adjacent piezoelectric sensor by a gap. Each piezoelectric sensor includes a cantilever beam having a proximal portion attached to the substrate and extending to a distal tip at a free end of the beam. The cantilevered beam has a width in plan view that is greater at a location distal of the proximal portion than at the proximal portion attached to the substrate. One or more electrodes are disposed on or in the proximal portion of the beam.

In accordance with another aspect of the disclosure, an electronic device is provided. The electronic device comprises a processor and an audio subsystem that communicates with the processor. The audio subsystem comprises one or more piezoelectric MEMS microphones on a substrate layer. Each microphone includes a substrate and a plurality of piezoelectric sensors movably coupled to the substrate. Each of the piezoelectric sensors is spaced apart from an adjacent piezoelectric sensor by a gap. Each piezoelectric sensor includes a cantilever beam having a proximal portion attached to the substrate and extending to a distal tip at a free end of the beam. The cantilevered beam has a width in plan view that is greater at a location distal of the proximal portion than at the proximal portion attached to the substrate. One or more electrodes are disposed on or in the proximal portion of the beam.

In accordance with another aspect of the disclosure, a method of making a piezoelectric sensor for a piezoelectric microelectromechanical systems microphone is provided. The method comprises forming or depositing one or more piezoelectric layers to define a beam extending between a proximal portion and a distal tip, the beam having a width in plan view that is greater at a location distal of the proximal portion than at the proximal portion. The method also comprises attaching the beam to a substrate in cantilever form so that the proximal portion of the beam is anchored to the substrate and the distal tip is a free unsupported end of the beam.

In accordance with another aspect of the disclosure a method of making a microphone module is provided. The method comprises forming or providing a printed circuit board that includes a substrate layer. The method also comprises forming or providing a piezoelectric microelectromechanical systems microphone via a process comprising (a) forming one or more cantilever piezoelectric sensors including forming or depositing one or more piezoelectric layers to define a beam extending between a proximal portion and a distal tip, the beam having a width in plan view that is greater at a location distal of the proximal portion than at the proximal portion, and (b) attaching the beam to a substrate in cantilever form so that the proximal portion of the beam is anchored to the substrate and the distal tip is a free unsupported end of the beam. The method also comprises mounting the one or more piezoelectric microelectromechanical systems microphones on the printed circuit board.

BRIEF DESCRIPTION OF THE DRAWINGS

FIGS. 5A-5C are schematic perspective views of different cantilevered sensor designs.

FIG. 6 is a graph of output voltage versus tip width for a cantilevered sensor.

DETAILED DESCRIPTION

Figure 1A:
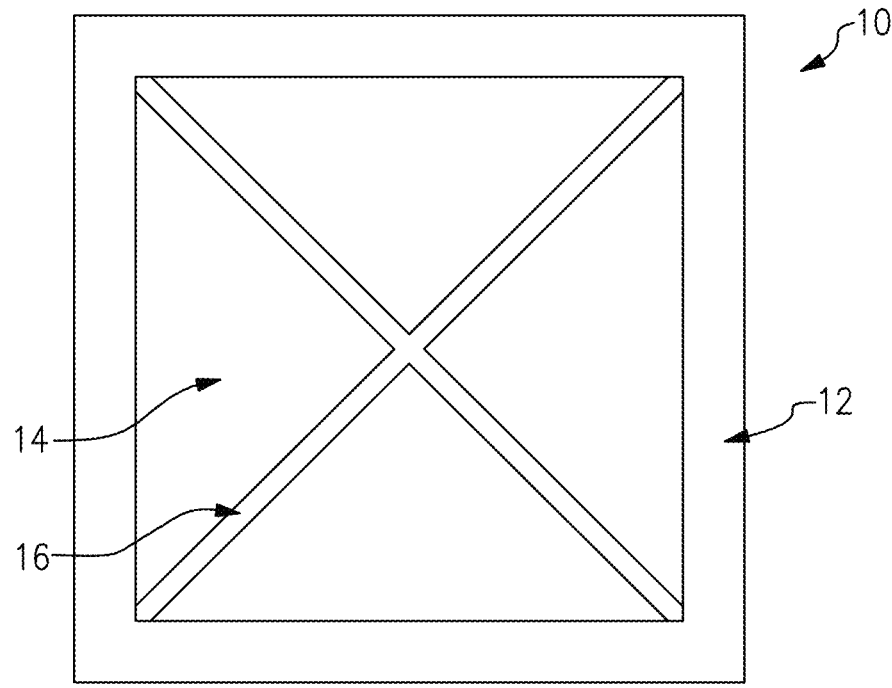
FIG. 1A is a schematic top view of a substrate and sensors for a conventional piezoelectric MEMS microphone.

The following detailed description of certain embodiments presents various descriptions of specific embodiments. However, the innovations described herein can be embodied in a multitude of different ways, for example, as defined and covered by the claims. In this description, reference is made to the drawings were like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Piezoelectric MEMS Microphone

Figure 1B:
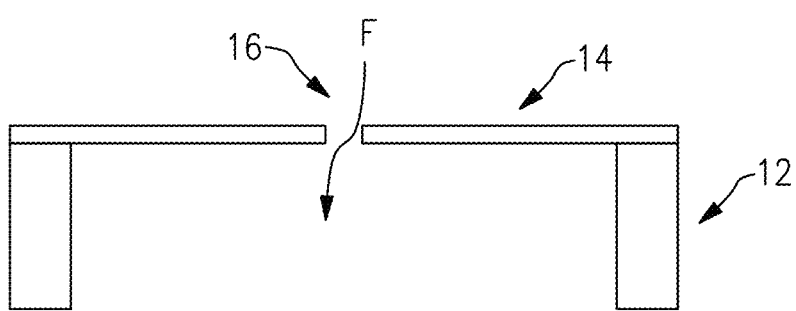
FIG. 1B is a schematic side view of the substrate and sensors for the piezoelectric MEMS microphone of FIG. 1A.

FIGS. 1A-1B show a conventional piezoelectric microelectromechanical systems (MEMS) microphone 10 (hereinafter the "microphone"). The microphone 10 has a substrate 12. The substrate 12 is optionally made of Silicon and may optionally have additional dielectric, metallic or semiconductor films deposited on it. The microphone 10 can have one or more piezoelectric sensors 14 (hereinafter "sensors") anchored to the substrate 12 in cantilever form with a gap 16 between adjacent sensors 14. The microphone 10 converts an acoustic signal to an electrical signal when a sound wave vibrates the sensors 14. The sensors 14 can be made from one or more layers of material. Optionally, the sensors 14 can be made at least in part of Aluminum Nitride (AlN). In another implementation, the sensors 14 can optionally be made at least in part of Scandium Aluminum Nitride (ScAlN) or other piezoelectric materials. The sensors 14 can include an electrode, which can optionally be made of molybdenum (Mo), titanium nitride (TiN), platinum (Pt) or ruthenium (Ru), in some implementations. The gaps 16 between the sensors 14 allow the sensors 14 to freely move, for airflow F to pass therethrough, and balance the pressure between both sides of the sensors 14. The gap 16 can be about 100-500 nm wide. The sensors 14 are preferably planar (e.g., flat), but are generally not completely flat due to a material internal stress gradient in the sensors 14.

Figure 1C:
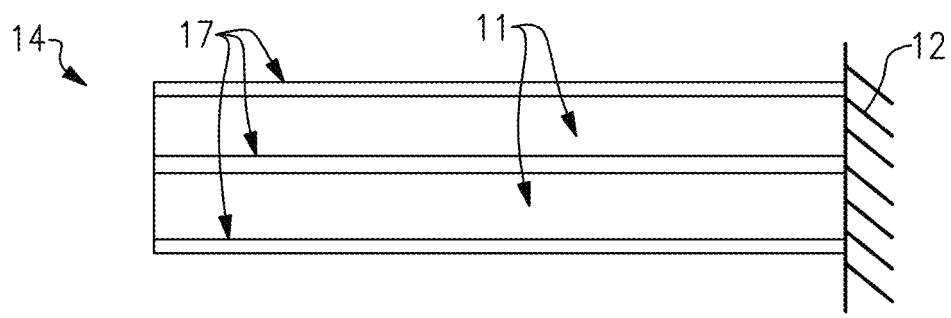
FIG. 1C is a schematic side view of another embodiment of the substrate and sensors for the piezoelectric MEMS microphone of FIG. 1A.

FIG. 1C shows another embodiment of a cantilevered piezoelectric sensor 14 attached to the substrate. The piezoelectric sensor 14 is a multilayer cantilevered structure with one or more piezoelectric layers 11 (e.g., two piezoelectric layers) and one or more conductive layers 17 (e.g., three metal electrode layers). As shown, in one example each piezoelectric layer 11 can be interposed between two conductive layers 17.

Figure 1D:
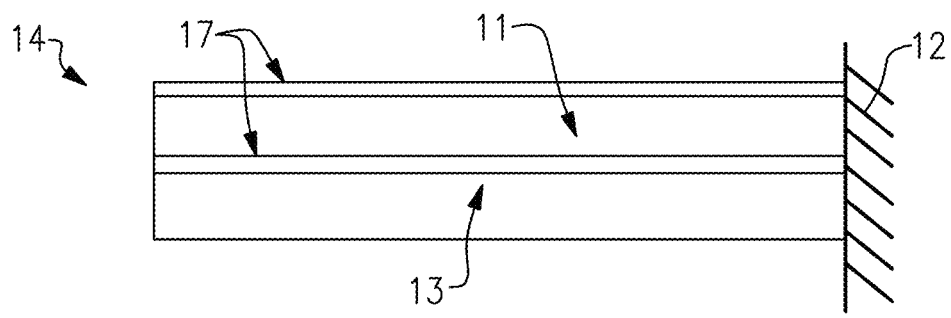
FIG. 1D is a schematic side view of another embodiment of the substrate and sensors for the piezoelectric MEMS microphone of FIG. 1A.

FIG. 1D shows another embodiment of a cantilevered piezoelectric sensor 14 attached to the substrate. The piezoelectric sensor 14 is a multilayer cantilevered structure with one or more piezoelectric layers 11 (e.g., one piezoelectric layer), one or more conductive layers 17 (e.g., two metal electrode layers), and one or more elastic layers 13. As shown, in one example a piezoelectric layer 11 can be interposed between two conductive layers 17 and the elastic layer 13 can be a bottom layer of the cantilevered structure.

Acoustic Devices with Increased Sensitivity

With reference to FIGS. 2A-13, the inventors have identified that widening the tips of cantilevered sensors in a piezoelectric MEMS microphone relative to the anchored end of the sensors can advantageously improve the output energy of the piezoelectric MEMS microphone, thereby improving the sensitivity of the piezoelectric MEMS microphone or allowing a reduction in the size of the piezoelectric MEMS microphone while providing the same output energy.

Figure 2A:
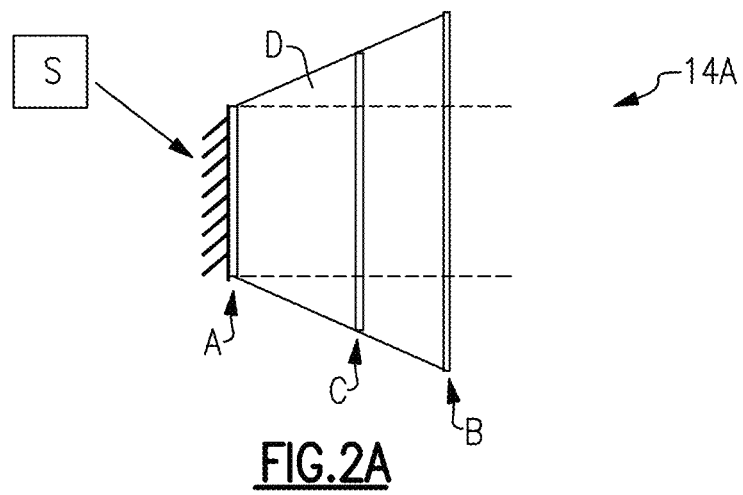
FIG. 2A is a schematic top view of one embodiment of a cantilevered sensor for use in a piezoelectric MEMS microphone.

FIG. 2A shows a schematic plan view of a cantilevered sensor 14A. The sensor 14A defines a beam D that has a proximal portion or end A anchored to the substrate S in cantilever form (e.g., so that there is a gap between adjacent sensors 14A). The proximal portion or end A is linear. The beam D extends to a distal tip B at a free end (e.g., unsupported end). The distal tip B is linear. As shown in FIG. 2A, the distal tip B has a width (in plan view) greater than a width of the proximal portion or end A. The side edges (e.g., opposite side edges) of the beam D extend linearly (e.g., a long a straight line) between the proximal portion or end A and the distal tip B. As shown in FIG. 2A, the beam D has a width at a location distal of the proximal portion A (e.g., at line C parallel to the proximal portion A) that is greater than the width at the proximal portion A. The beam D is symmetrical about a centerline of the beam D extending from the proximal portion to the distal tip B. In the illustrated implementation, the beam D has a generally trapezoidal shape (e.g., isosceles trapezoid).

The sensor 14A is preferably planar (e.g., flat), but are generally not completely flat due to a material internal stress gradient in the sensor 14A. The sensor 14A can be made from one or more layers of material. Optionally, the sensor 14A can be made at least in part of Aluminum Nitride (AlN). In another implementation, the sensor 14A can optionally be made at least in part of Scandium Aluminum Nitride (ScAlN). The sensor 14A can include an electrode, which can optionally be made of molybdenum (Mo), titanium nitride (TiN), platinum (Pt) or ruthenium (Ru), in some implementations. The gaps between the sensors 14A (as further discussed below) allow the sensors 14A to freely move, for airflow F to pass therethrough, and balance the pressure between both sides of the sensors 14A. Such gaps between the sensors 14A can be about 100-500 nm wide.

Figure 2B:
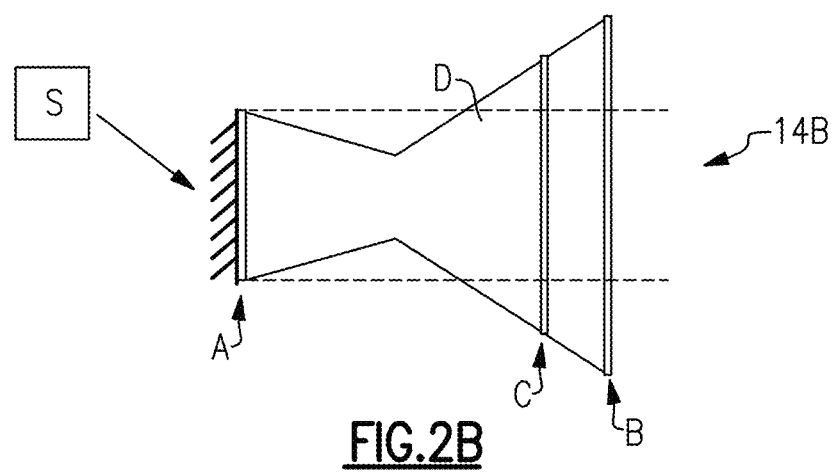
FIG. 2B is a schematic top view of one embodiment of a cantilevered sensor for use in a piezoelectric MEMS microphone.

FIG. 2B shows a schematic plan view of a cantilevered sensor 14B. Some of the features of the sensor 14B are similar to features of the sensor 14A in FIG. 2A. Thus, reference identifiers used to designate the various components of the sensor 14B are identical to those used for identifying the corresponding components of the sensor 14A in FIG. 2A. Therefore, the structure and description for the various features of the sensor 14A in FIG. 2A are understood to also apply to the corresponding features of the sensor 14B in FIG. 2B, except as described below.

The sensor 14B differs from the sensor 14A in that a width of the beam D decreases linearly between the proximal portion A and an intermediate portion, before the width increases linearly to the distal tip B. As shown in FIG. 2B, the beam D has a width at a location distal of the proximal portion A (e.g., at line C parallel to the proximal portion A) that is greater than the width at the proximal portion A. The beam D is symmetrical about a centerline of the beam D and the width (in plan view) of the distal tip B is greater than the width of the proximal portion or end A.

Figure 2C:
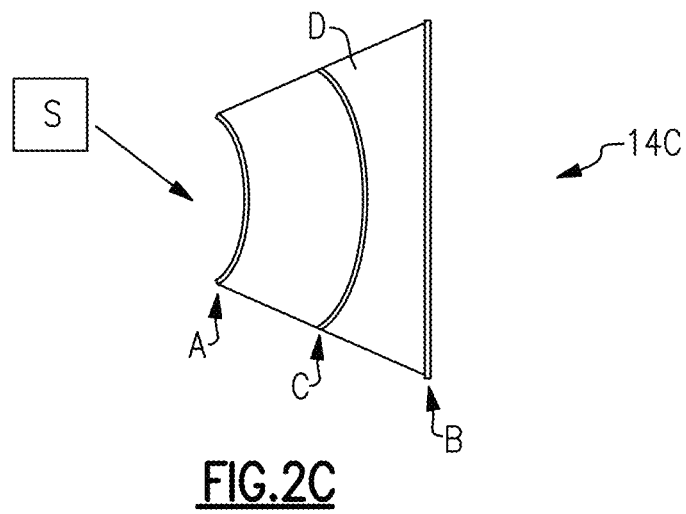
FIG. 2C is a schematic top view of one embodiment of a cantilevered sensor for use in a piezoelectric MEMS microphone.

FIG. 2C shows a schematic plan view of a cantilevered sensor 14C. Some of the features of the sensor 14C are similar to features of the sensor 14A in FIG. 2A. Thus, reference identifiers used to designate the various components of the sensor 14C are identical to those used for identifying the corresponding components of the sensor 14A in FIG. 2A. Therefore, the structure and description for the various features of the sensor 14A in FIG. 2A are understood to also apply to the corresponding features of the sensor 14C in FIG. 2C, except as described below.

The sensor 14C differs from the sensor 14A in that the proximal portion or end A has a curved shape, while the distal tip B has a linear shape. The width of the beam D increases linearly from the proximal portion or end A to the distal tip B. As shown in FIG. 2C, the beam D has a width at a location distal of the proximal portion A (e.g., at line C parallel to the proximal portion A) that is greater than the width at the proximal portion A. The width (in plan view) of the distal tip B is greater than the width (e.g., tracing the curved line) of the proximal portion or end A. The beam D is symmetrical about a centerline of the beam D.

Figure 2D:
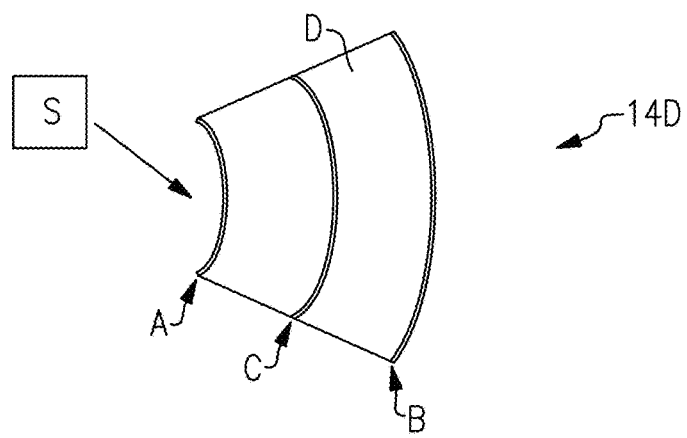
FIG. 2D is a schematic top view of one embodiment of a cantilevered sensor for use in a piezoelectric MEMS microphone.

FIG. 2D shows a schematic plan view of a cantilevered sensor 14D. Some of the features of the sensor 14D are similar to features of the sensor 14A in FIG. 2A. Thus, reference identifiers used to designate the various components of the sensor 14D are identical to those used for identifying the corresponding components of the sensor 14A in FIG. 2A. Therefore, the structure and description for the various features of the sensor 14A in FIG. 2A are understood to also apply to the corresponding features of the sensor 14D in FIG. 2D, except as described below.

The sensor 14D differs from the sensor 14A in that the proximal portion or end A has a curved shape, and in that the distal tip B has a curved shape. The width of the beam D increases linearly from the proximal portion or end A to the distal tip B. As shown in FIG. 2D, the beam D has a width at a location distal of the proximal portion A (e.g., at line C parallel to the proximal portion A) that is greater than the width at the proximal portion. The width (in plan view, tracing the curved line) of the distal tip B is greater than the width (e.g., tracing the curved line) of the proximal portion or end A. The beam D is symmetrical about a centerline of the beam D.

Figure 2E:
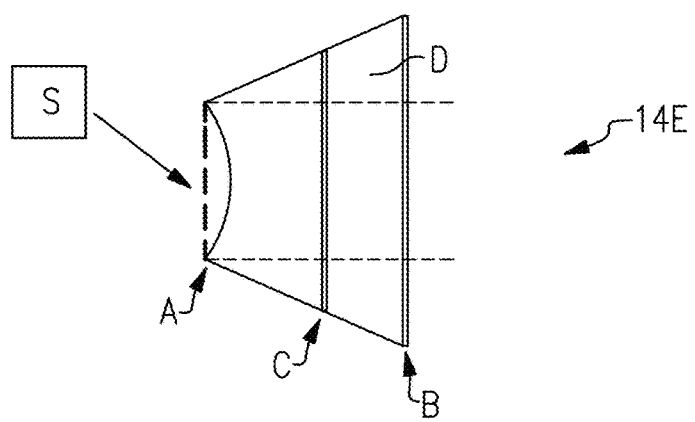
FIG. 2E is a schematic top view of one embodiment of a cantilevered sensor for use in a piezoelectric MEMS microphone.

FIG. 2E shows a schematic plan view of a cantilevered sensor 14E. Some of the features of the sensor 14E are similar to features of the sensor 14A in FIG. 2A. Thus, reference identifiers used to designate the various components of the sensor 14E are identical to those used for identifying the corresponding components of the sensor 14A in FIG. 2A. Therefore, the structure and description for the various features of the sensor 14A in FIG. 2A are understood to also apply to the corresponding features of the sensor 14E in FIG. 2E, except as described below.

The sensor 14E differs from the sensor 14A in that the proximal portion or end A has a curved shape, while the distal tip B has a linear shape. The width of the beam D increases linearly from the proximal portion or end A to the distal tip B. As shown in FIG. 2E, the beam D has a width at a location distal of the proximal portion A (e.g., at line C parallel to a virtual line between ends of the proximal portion A) that is greater than the width at the proximal portion A. The width (in plan view) of the distal tip B is greater than the width (e.g., tracing a virtual line between end points of the curved line) of the proximal portion or end A. The beam D is symmetrical about a centerline of the beam D.

Figure 2F:
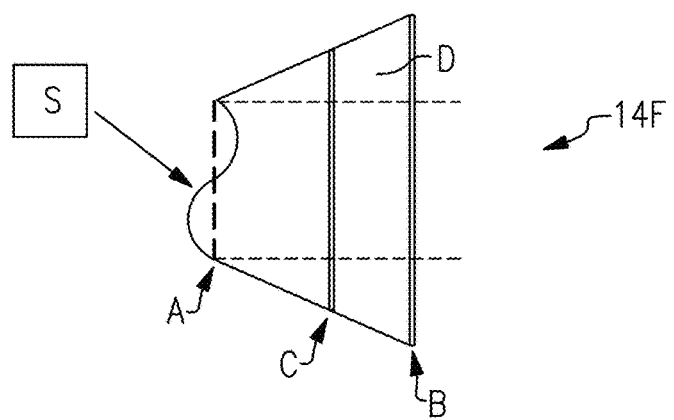
FIG. 2F is a schematic top view of one embodiment of a cantilevered sensor for use in a piezoelectric MEMS microphone.

FIG. 2F shows a schematic plan view of a cantilevered sensor 14F. Some of the features of the sensor 14F are similar to features of the sensor 14A in FIG. 2A. Thus, reference identifiers used to designate the various components of the sensor 14F are identical to those used for identifying the corresponding components of the sensor 14A in FIG. 2A. Therefore, the structure and description for the various features of the sensor 14A in FIG. 2A are understood to also apply to the corresponding features of the sensor 14F in FIG. 2C, except as described below.

The sensor 14F differs from the sensor 14A in that the proximal portion or end A has an S-curved shape, while the distal tip B has a linear shape. The width of the beam D increases linearly from the proximal portion or end A to the distal tip B. As shown in FIG. 2F, the beam D has a width at a location distal of the proximal portion A (e.g., at line C parallel to a virtual line between end points of the proximal portion A) that is greater than the width at the proximal portion A. The width (in plan view) of the distal tip B is greater than the width (e.g., tracing a virtual line between end points of the curved line) of the proximal portion or end A. The beam D is asymmetrical about a centerline of the beam D.

Figure 3A:
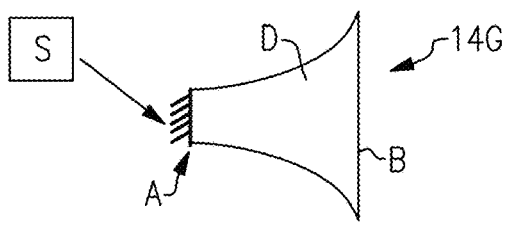
FIG. 3A is a schematic top view of one embodiment of a cantilevered sensor for use in a piezoelectric MEMS microphone.

FIG. 3A shows a schematic plan view of a cantilevered sensor 14G. Some of the features of the sensor 14G are similar to features of the sensor 14A in FIG. 2A. Thus, reference identifiers used to designate the various components of the sensor 14G are identical to those used for identifying the corresponding components of the sensor 14A in FIG. 2A. Therefore, the structure and description for the various features of the sensor 14A in FIG. 2A are understood to also apply to the corresponding features of the sensor 14G in FIG. 3A, except as described below.

The sensor 14G differs from the sensor 14A in that the side edges (e.g., opposite side edges) of the beam D extend along a curved line between the proximal portion or end A and the distal tip B. In the illustrated embodiment, the side edge S of the beam D extends along concave curved lines between the proximal portion A and the distal tip B. In other implementations, the side edges of the beam D can extend along convex curved lines between the proximal portion A and the distal tip B. The width of the beam D increases from the proximal portion or end A to the distal tip B. As shown in FIG. 3A, the beam D has a width at a location distal of the proximal portion A (e.g., at line parallel to the proximal portion A) that is greater than the width at the proximal portion A. The width (in plan view) of the distal tip B is greater than the width of the proximal portion or end A. The beam D is symmetrical about a centerline of the beam D.

Figure 3D:
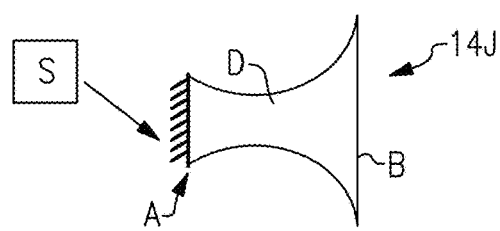
FIG. 3D is a schematic top view of one embodiment of a cantilevered sensor for use in a piezoelectric MEMS microphone.
Figure 3B:
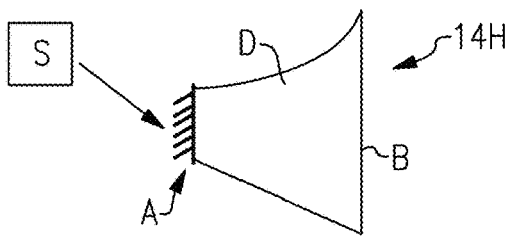
FIG. 3B is a schematic top view of one embodiment of a cantilevered sensor for use in a piezoelectric MEMS microphone.

FIG. 3B shows a schematic plan view of a cantilevered sensor 14H. Some of the features of the sensor 14H are similar to features of the sensor 14A in FIG. 2A. Thus, reference identifiers used to designate the various components of the sensor 14H are identical to those used for identifying the corresponding components of the sensor 14A in FIG. 2A. Therefore, the structure and description for the various features of the sensor 14A in FIG. 2A are understood to also apply to the corresponding features of the sensor 14H in FIG. 3B, except as described below.

The sensor 14H differs from the sensor 14A in that one of the side edges of the beam D extends linearly (e.g., along a straight line, at a non-perpendicular angle relative to a plane defined by the proximal portion or end A) between the proximal portion or end A and the distal tip B, and the other of the side edges (e.g., opposite side edge) of the beam D extends along a curved line (e.g., concave, convex) between the proximal portion or end A and the distal tip B. The width of the beam D increases from the proximal portion or end A to the distal tip B. As shown in FIG. 3B, the beam D has a width at a location distal of the proximal portion A (e.g., at line parallel to the proximal portion A) that is greater than the width at the proximal portion A. The width (in plan view) of the distal tip B is greater than the width of the proximal portion or end A. The beam D is asymmetrical about a centerline of the beam D.

Figure 3E:
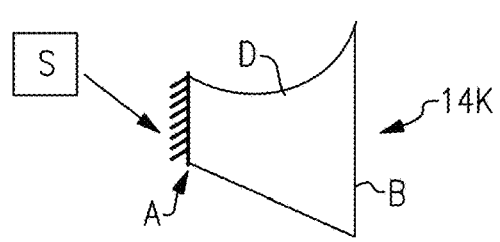
FIG. 3E is a schematic top view of one embodiment of a cantilevered sensor for use in a piezoelectric MEMS microphone.
Figure 3C:
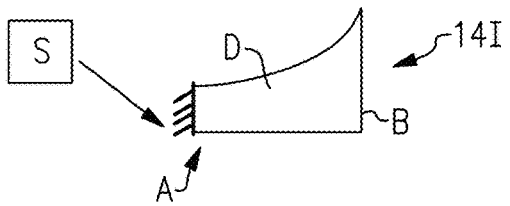
FIG. 3C is a schematic top view of one embodiment of a cantilevered sensor for use in a piezoelectric MEMS microphone.

FIG. 3C shows a schematic plan view of a cantilevered sensor 14I. Some of the features of the sensor 14I are similar to features of the sensor 14A in FIG. 2A. Thus, reference identifiers used to designate the various components of the sensor 14I are identical to those used for identifying the corresponding components of the sensor 14A in FIG. 2A. Therefore, the structure and description for the various features of the sensor 14A in FIG. 2A are understood to also apply to the corresponding features of the sensor 14I in FIG. 3C, except as described below.

The sensor 14I differs from the sensor 14A in that one of the side edges of the beam D extends linearly (e.g., along a straight line perpendicular to a plane defined by the proximal portion or end A) between the proximal portion or end A and the distal tip B, and the other of the side edges (e.g., opposite side edge) of the beam D extends along a curved line (e.g., concave, convex) between the proximal portion or end A and the distal tip B. The width of the beam D increases from the proximal portion or end A to the distal tip B. As shown in FIG. 3C, the beam D has a width at a location distal of the proximal portion A (e.g., at line parallel to the proximal portion A) that is greater than the width at the proximal portion A. The width (in plan view) of the distal tip B is greater than the width of the proximal portion or end A. The beam D is asymmetrical about a centerline of the beam D.

FIG. 3D shows a schematic plan view of a cantilevered sensor 14J. Some of the features of the sensor 14J are similar to features of the sensor 14A in FIG. 2A. Thus, reference identifiers used to designate the various components of the sensor 14J are identical to those used for identifying the corresponding components of the sensor 14A in FIG. 2A. Therefore, the structure and description for the various features of the sensor 14A in FIG. 2A are understood to also apply to the corresponding features of the sensor 14J in FIG. 3D, except as described below.

The sensor 14J differs from the sensor 14A in that the side edges (e.g., opposite side edges) of the beam D extend along a curved line between the proximal portion or end A and the distal tip B. In the illustrated embodiment, the side edges of the beam D extend along concave curved lines between the proximal portion A and the distal tip B. In other implementations, the side edges of the beam D can extend along convex curved lines between the proximal portion A and the distal tip B. The width of the beam D decreases in a curved manner to an intermediate portion and increases in a curved manner from the intermediate portion to the distal tip B. As shown in FIG. 3D, the beam D has a width at a location distal of the proximal portion A (e.g., at line parallel to the proximal portion A) that is greater than the width at the proximal portion A. The width (in plan view) of the distal tip B is greater than the width of the proximal portion or end A. The beam D is symmetrical about a centerline of the beam D.

FIG. 3E shows a schematic plan view of a cantilevered sensor 14K. Some of the features of the sensor 14K are similar to features of the sensor 14A in FIG. 2A. Thus, reference identifiers used to designate the various components of the sensor 14K are identical to those used for identifying the corresponding components of the sensor 14A in FIG. 2A. Therefore, the structure and description for the various features of the sensor 14A in FIG. 2A are understood to also apply to the corresponding features of the sensor 14K in FIG. 3E, except as described below.

The sensor 14K differs from the sensor 14A in that one of the side edges of the beam D extends linearly (e.g., along a straight line, at a non-perpendicular angle relative to a plane defined by the proximal portion or end A) between the proximal portion or end A and the distal tip B, and the other of the side edges (e.g., opposite side edge) of the beam D extends along a curved line between the proximal portion or end A and the distal tip B. In the illustrated embodiment, the side edge of the beam D extends along concave curved line between the proximal portion A and the distal tip B. In other implementations, the side edge of the beam D can extend along convex curved line between the proximal portion A and the distal tip B. The width of the beam D decreases between the proximal portion or end A and an intermediate portion and then increases from the intermediate portion to the distal tip B. As shown in FIG. 3E, the beam D has a width at a location distal of the proximal portion A (e.g., at line parallel to the proximal portion A) that is greater than the width at the proximal portion A. The width (in plan view) of the distal tip B is greater than the width of the proximal portion or end A. The beam D is asymmetrical about a centerline of the beam D.

Figure 3F:
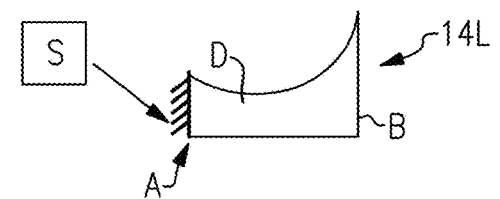
FIG. 3F is a schematic top view of one embodiment of a cantilevered sensor for use in a piezoelectric MEMS microphone.

FIG. 3F shows a schematic plan view of a cantilevered sensor 14L. Some of the features of the sensor 14L are similar to features of the sensor 14A in FIG. 2A. Thus, reference identifiers used to designate the various components of the sensor 14L are identical to those used for identifying the corresponding components of the sensor 14A in FIG. 2A. Therefore, the structure and description for the various features of the sensor 14A in FIG. 2A are understood to also apply to the corresponding features of the sensor 14L in FIG. 3F, except as described below.

The sensor 14L differs from the sensor 14A in that one of the side edges of the beam D extends linearly (e.g., along a straight line perpendicular relative to a plane defined by the proximal portion or end A) between the proximal portion or end A and the distal tip B, and the other of the side edges (e.g., opposite side edge) of the beam D extends along a curved line between the proximal portion or end A and the distal tip B. In the illustrated embodiment, the side edge of the beam D extends along concave curved line between the proximal portion A and the distal tip B. In other implementations, the side edge of the beam D can extend along convex curved line between the proximal portion A and the distal tip B. The width of the beam D decreases between the proximal portion or end A and an intermediate portion and then increases from the intermediate portion to the distal tip B. As shown in FIG. 3F, the beam D has a width at a location distal of the proximal portion A (e.g., at line parallel to the proximal portion A) that is greater than the width at the proximal portion A. The width (in plan view) of the distal tip B is greater than the width of the proximal portion or end A. The beam D is asymmetrical about a centerline of the beam D.

With reference to the sensors 14G to 14L in FIGS. 3A-3F, though the distal tip B is shown as being linear (e.g., extending along a straight line), in other implementations the distal tip B can instead be curved (e.g., define a concave or convex edge).

Figure 4:
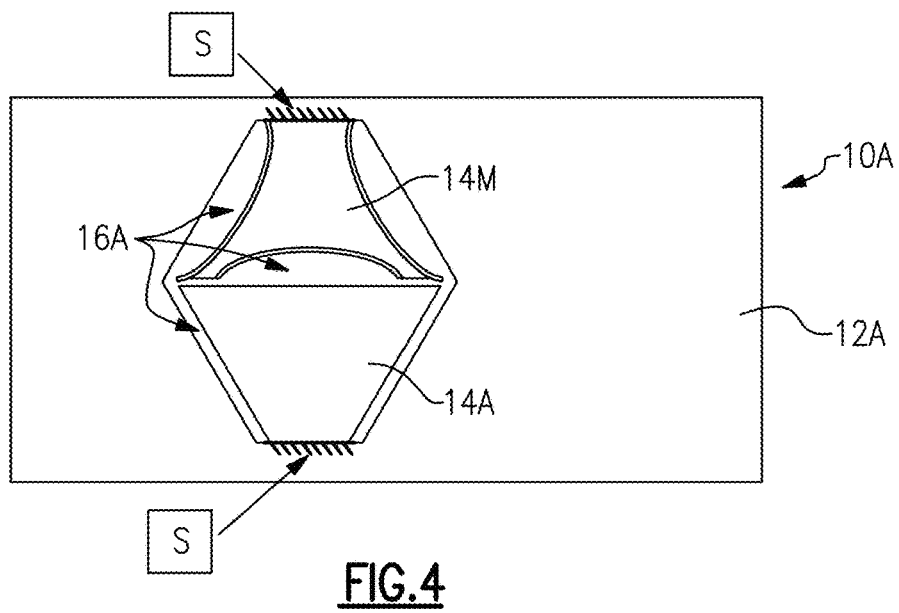
FIG. 4 is a schematic top view of one embodiment of an arrangement of sensors on a substrate for a piezoelectric MEMS microphone.

FIG. 4 shows a schematic top view of a piezoelectric MEMS microphone 10A with a substrate 12A. The cantilevered sensor 14A (e.g., described above with respect to FIG. 2A) is attached via an anchor S to the substrate 12A, and a cantilevered sensor 14M attached via an anchor S to the substrate 12A and arranged opposite to the cantilevered sensor 14A. The cantilevered sensor 14M is similar to the cantilevered sensor 14G (e.g., described above with respect to FIG. 3A), except that the distal tip surface includes a curved (e.g., concave) surface. Gaps 16A (e.g., etched in the substrate 12A) between the cantilevered sensors 14A, 14M and the substrate 12A and/or between the distal tips of the cantilevered sensors 14A, 14M can advantageously be sized to increase the −3 dB roll off to inhibit (e.g., reduce) a risk of damage to the MEMS microphone from vocal plosives, which occur at low frequencies.

FIG. 5A shows a schematic perspective view of a cantilevered sensor 15A that extends between a proximal portion or end A that can be anchored to a substrate (e.g., of a piezoelectric MEMS microphone) and a distal tip or end B. The width of the proximal portion A is greater than the width of the distal tip B. The cantilevered sensor 15A has a length of 400 μm, the proximal portion A has a width of 300 μm and the distal tip B has a width of 100 μm. FIG. 5B shows a schematic perspective view of a cantilevered sensor 15B that extends between a proximal portion or end A that can be anchored to a substrate (e.g., of a piezoelectric MEMS microphone) and a distal tip or end B. The width of the proximal portion A is equal to the width of the distal tip B. The cantilevered sensor 15B has a length of 400 μm, and the proximal portion A and distal tip B both have a width of 300 μm. FIG. 5C shows a schematic perspective view of a cantilevered sensor 15C that extends between a proximal portion or end A that can be anchored to a substrate (e.g., of a piezoelectric MEMS microphone) and a distal tip or end B. The width of the proximal portion A is smaller than the width of the distal tip B. The cantilevered sensor 15C has a length of 400 μm, the proximal portion A has a width of 300 μm and the distal tip B has a width of 500 μm. The cantilevered sensors 15A, 15B, 15C include two piezoelectric layers of Aluminum Nitride (AlN), each 300 nm thick and three layers of ruthenium (Ru) as electrodes, each 30 nm thick.

FIG. 6 is a graph of output voltage (in mV) versus width (in μm) for the distal tip B, for cantilevered sensors extending between a proximal portion A that is anchored (e.g., on a substrate) and the distal tip B (e.g., at a free or unsupported end of the cantilevered sensor), including cantilevered sensors 15A-15C. As shown in the graph, output voltage for the cantilevered sensor advantageously increases as the width of the distal tip B of the cantilevered sensor increases (e.g., relative to the width of the proximal portion or end A that is anchored to the substrate).

Figure 7:
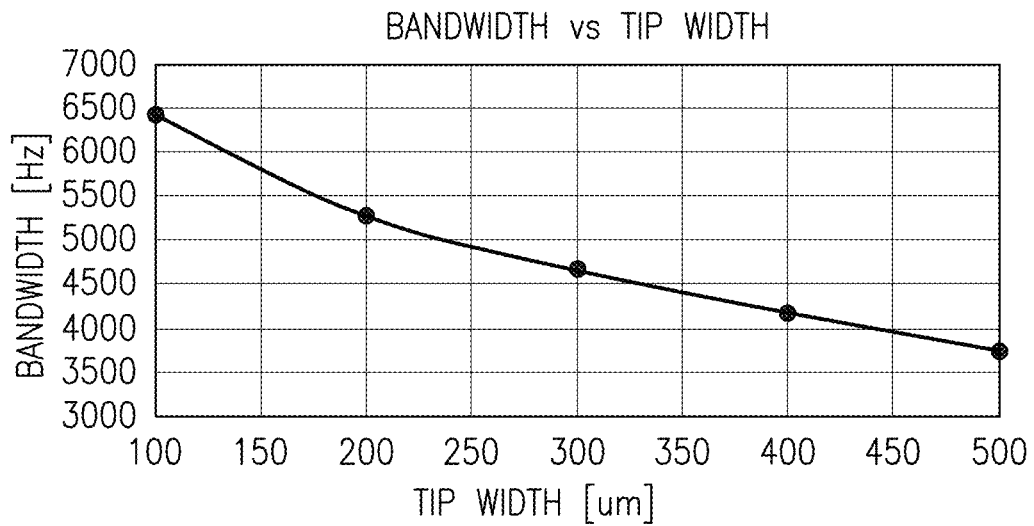
FIG. 7 is a graph of bandwidth versus tip width for a cantilevered sensor.

FIG. 7 is a graph of bandwidth (in Hz) versus width (in μm) for the distal tip B, for cantilevered sensors extending between a proximal portion A that is anchored (e.g., on a substrate) and the distal tip B (e.g., at a free or unsupported end of the cantilevered sensor), including cantilevered sensors 15A-15C. As shown in the graph, bandwidth for the cantilevered sensor decreases as the width of the distal tip B of the cantilevered sensor increases (e.g., relative to proximal portion A that is anchored to the substrate). The cantilevered sensors 15A-15C can advantageously be designed to meet a bandwidth requirement while achieving increased output energy by increasing the width of the distal tip of the cantilevered sensor relative to its proximal portion A or anchored end.

Figure 8A:
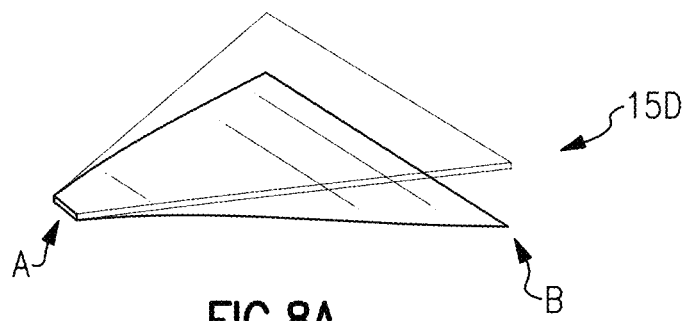
FIGS. 8A-8B are schematic perspective views of different cantilevered sensor designs.
Figure 8B:
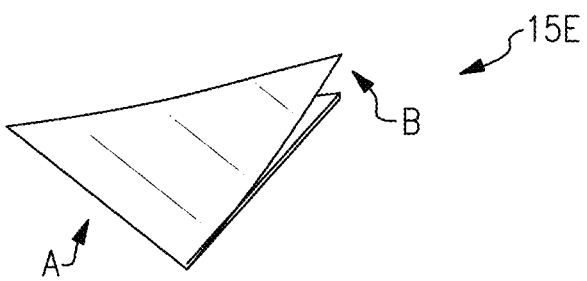

FIG. 8A shows a schematic perspective view of a cantilevered sensor 15D that extends between a proximal portion or end A that can be anchored to a substrate (e.g., of a piezoelectric MEMS microphone) and a distal tip or end B. The width of the proximal portion A is smaller than the width of the distal tip B. FIG. 8B shows a schematic perspective view of a cantilevered sensor 15E that extends between a proximal portion or end A that can be anchored to a substrate (e.g., of a piezoelectric MEMS microphone) and a distal tip or end B. The width of the proximal portion A is greater than the width of the distal tip B. The cantilevered sensors 15D and 15E have the same device area.

Figure 9:
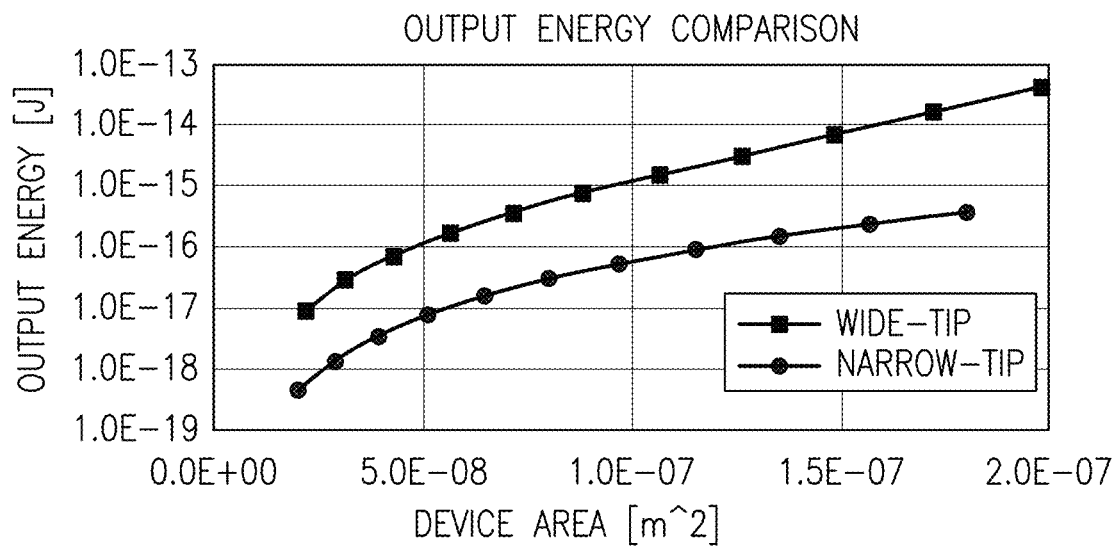
FIG. 9 is a graph of output energy versus device area for the cantilevered sensor designs in FIGS. 8A-8B.

FIG. 9 is a graph of output energy (in Joules) versus device area (in m²) for the distal tip B, for cantilevered sensors extending between a proximal portion A anchored (e.g., on a substrate) and the distal tip B (e.g., at a free or unsupported end of the cantilevered sensor), including cantilevered sensors 15D-15E. As shown in the graph, the output energy for the cantilevered sensor advantageously is greater (e.g., more than ten times higher) where the distal tip is wide (e.g., has a greater width relative to proximal portion A that is anchored), as compared with a cantilevered sensor where the distal tip is narrow (e.g., smaller width relative to proximal portion A that is anchored), where the cantilevered sensors have the same device area.

Figure 10:
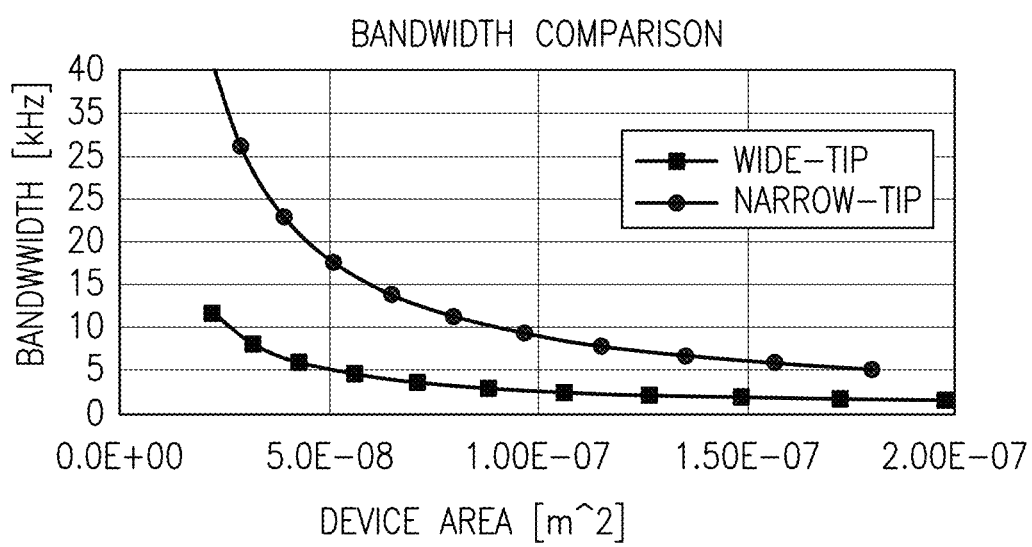
FIG. 10 is a graph of bandwidth versus device area for the cantilevered sensor designs in FIGS. 8A-8B.

FIG. 10 is a graph of bandwidth (in kHz) versus device area (in m²) for the distal tip B, for cantilevered sensors extending between a proximal portion A that is anchored (e.g., on a substrate) and the distal tip B (e.g., at a free or unsupported end of the cantilevered sensor), including cantilevered sensors 15D-15E. As shown in the graph, bandwidth for the cantilevered sensor is lower when the distal tip is wide (e.g., has a greater width), as compared with a cantilevered sensor where the distal tip is narrow (e.g., smaller width), where the cantilevered sensors have the same device area.

Figure 11:
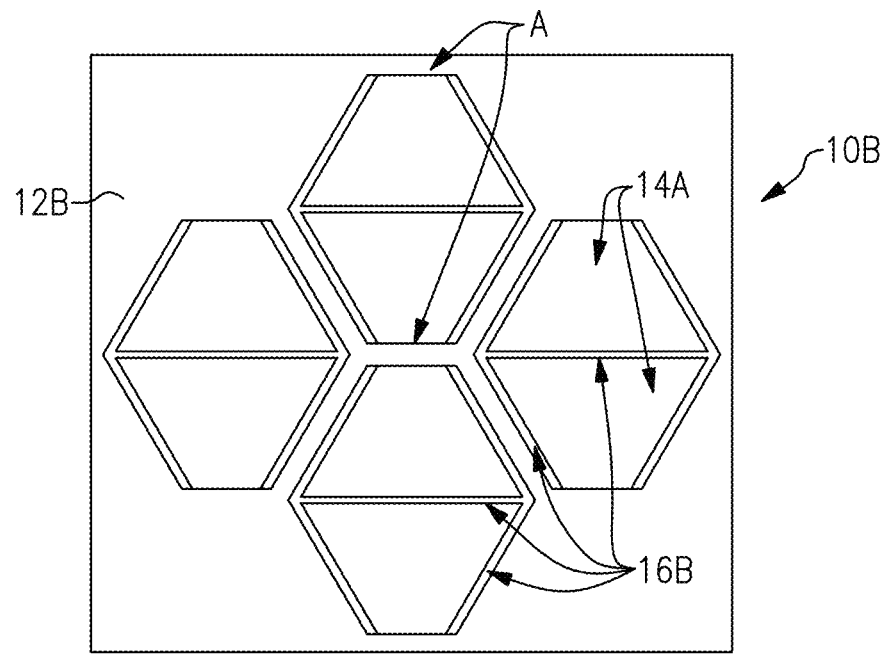
FIG. 11 is a schematic top view of one embodiment of an arrangement of sensors on a substrate for a piezoelectric MEMS microphone.

FIG. 11 shows one configuration (e.g., area-efficient configuration) of a piezoelectric MEMS microphone 10B with cantilevered sensors 14A (e.g., described above in connection with FIG. 2A) having anchored ends A on a substrate 12B. One or more pairs (e.g., three pairs) of the cantilevered sensors 14A can be arranged opposite each other (e.g., so that the distal tip or free unsupported end of the sensors 14A face each other). Gaps 16B (e.g., etched trenches in the substrate 12B) between the cantilevered sensors 14A and the substrate 12B or between the distal tips of the sensors 14A allow the sensors 14A to freely move and for airflow to pass therethrough. Though the arrangement in FIG. 11 includes the cantilevered sensors 14A, one of skill in the art will recognize that the arrangement can instead include any of the other cantilevered sensor designs disclosed here (e.g., cantilevered sensors 14B to 14M). Advantageously, the configuration in FIG. 11 can increase output energy for the piezoelectric MEMS microphone.

Figure 12:
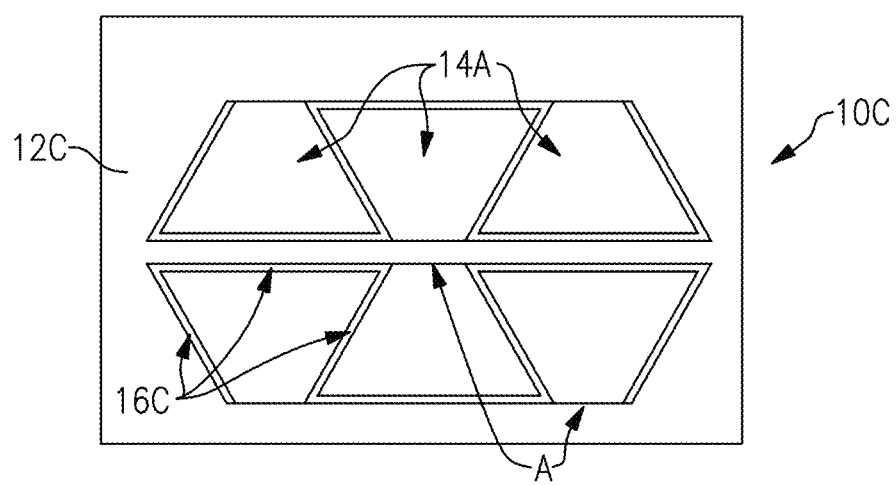
FIG. 12 is a schematic top view of one embodiment of an arrangement of sensors on a substrate for a piezoelectric MEMS microphone.

FIG. 12 shows another configuration (e.g., area-efficient configuration) of a piezoelectric MEMS microphone 10C with cantilevered sensors 14A (e.g., described above in connection with FIG. 2A) having anchored ends A on a substrate 12C. The cantilevered sensors 14A can be arranged in one or more (e.g., two) rows, where adjacent cantilevered sensors 14A can alternate in orientation along the row (e.g., anchored end A of one sensor 14A generally aligned with a distal tip of an adjacent sensor 14A). Gaps 16C (e.g., etched trenches in the substrate 12C) between the cantilevered sensors 14A and the substrate 12C allow the sensors 14A to freely move and for airflow to pass therethrough. Though the arrangement in FIG. 12 includes the cantilevered sensors 14A, one of skill in the art will recognize that the arrangement can instead include any of the other cantilevered sensor designs disclosed here (e.g., cantilevered sensors 14B to 14M). Advantageously, the configuration in FIG. 12 can increase output energy for the piezoelectric MEMS microphone.

Figure 13:
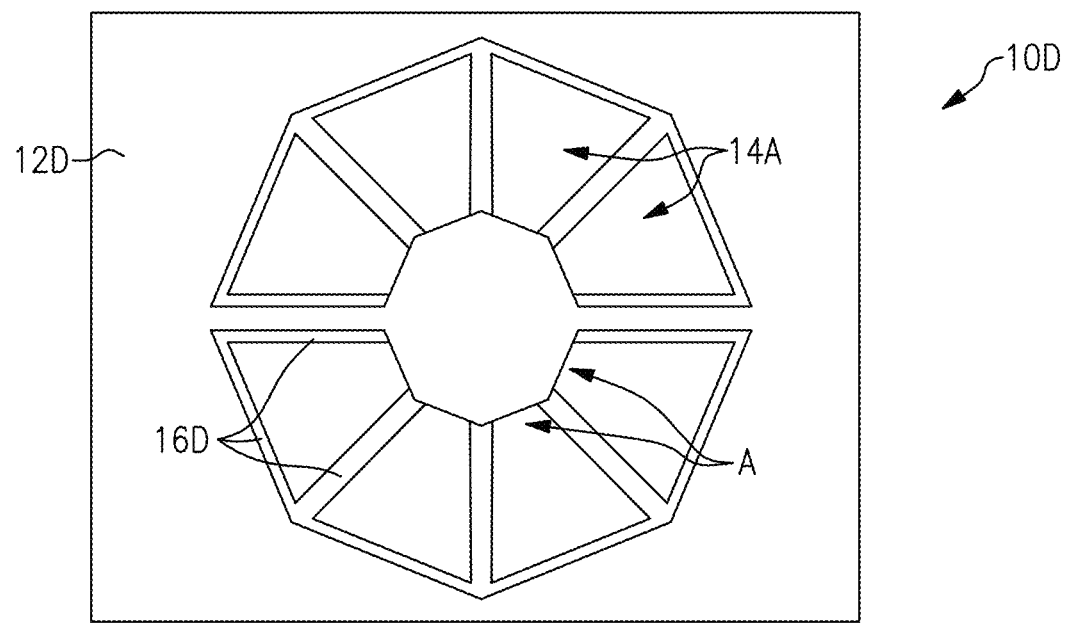
FIG. 13 is a schematic top view of one embodiment of an arrangement of sensors on a substrate for a piezoelectric MEMS microphone.

FIG. 13 shows another configuration (e.g., area-efficient configuration) of a piezoelectric MEMS microphone 10D with cantilevered sensors 14A (e.g., described above in connection with FIG. 2A) having anchored ends A on a substrate 12D. The cantilevered sensors 14A can be arranged in a circular manner, where the anchored ends A of the cantilevered sensors 14A generally define a first circular shape, and the distal tips of the cantilevered sensors 14A generally define a second circular shape that is larger than the first circular shape. Gaps 16D (e.g., etched trenches in the substrate 12D) between the cantilevered sensors 14A and the substrate 12D allow the sensors 14A to freely move and for airflow to pass therethrough. Though the arrangement in FIG. 13 includes the cantilevered sensors 14A, one of skill in the art will recognize that the arrangement can instead include any of the other cantilevered sensor designs disclosed here (e.g., cantilevered sensors 14B to 14M). Advantageously, the configuration in FIG. 13 can increase output energy for the piezoelectric MEMS microphone.

Figure 14:
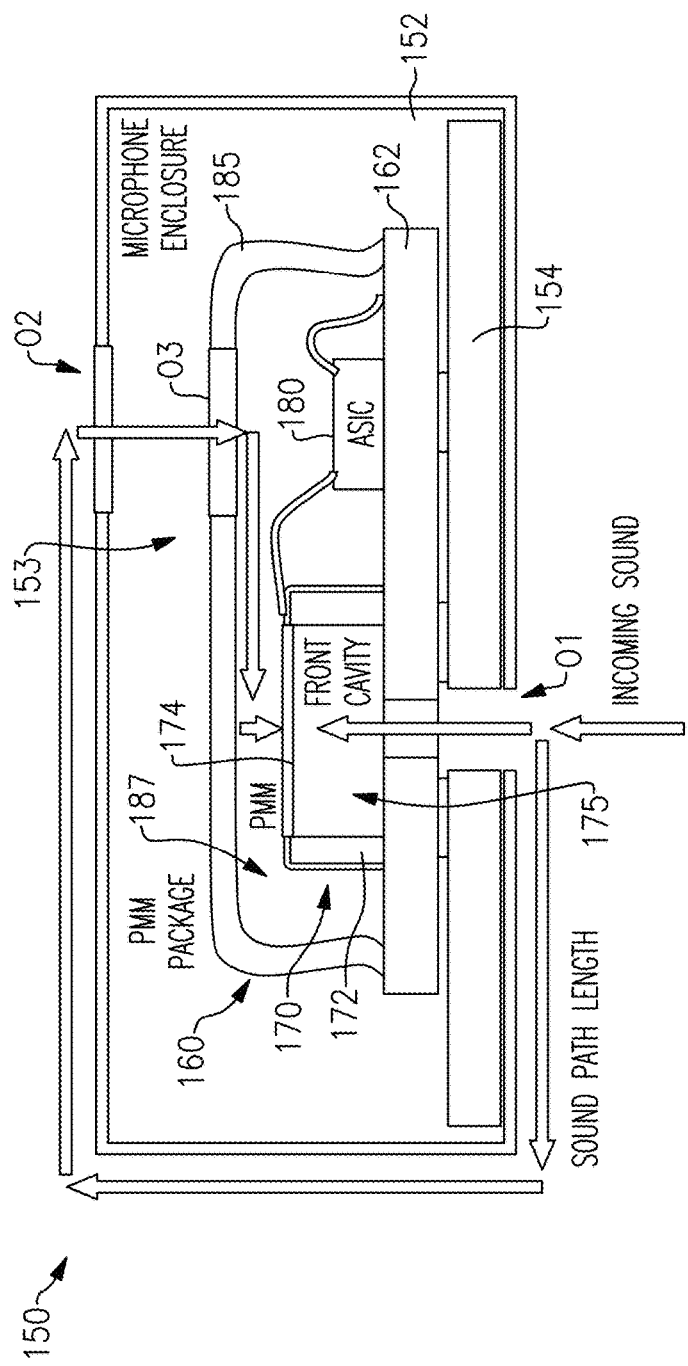
FIG. 14 is a schematic cross-sectional view of a piezoelectric MEMS microphone.

One or more (e.g., a plurality of) cantilevered sensors disclosed herein (e.g., sensors 14A-14M) can be incorporated into a piezoelectric MEMS microphone, for example arranged in area-efficient configurations, such as those illustrated in FIGS. 4 and 11-13. For example, FIG. 14 shows a two-port microphone module 150 that has a piezoelectric MEMS microphone package (the "PMM package") 160 coupled to (e.g., mounted on) a printed circuit board 154 and enclosed by a microphone enclosure 152, a cavity 153 defined between the microphone enclosure 152 and the PMM package 160. The PMM package 160 has a package substrate 162 on which a piezoelectric MEMS microphone 170 and one or more application specific integrated circuit (ASIC) modules 180 are mounted. The ASIC module(s) 180 are electrically connected to the piezoelectric MEMS microphone 170 and the package substrate 162. The piezoelectric MEMS microphone 170 includes a substrate 172 attached to the package substrate 162 and one or more (e.g., multiple) cantilevered sensors 174 attached to the substrate 172 so as to define a front cavity 175 between the package substrate 162 and the cantilevered sensors 174. The cantilevered sensor(s) 174 can have any configuration disclosed herein (e.g., for the cantilevered sensors 14A-14M), and can be arranged in area-efficient configurations (e.g., as illustrated in FIGS. 4 and 11-13). The PMM package 160 includes a package cap 185 that encloses the piezoelectric MEMS microphone 170 and ASIC module(s) 180 and is disposed over the package substrate 162, where a rear cavity 187 is defined between the package cap 185 and the piezoelectric MEMS microphone 170.

Sound enters the microphone module 150 along a first path through a first sound inlet O1 in the microphone enclosure 152, printed circuit board 154 and package substrate 162 and into the front cavity 175. Sound also enters the microphone module 150 along a second path through a second sound inlet O2 in the microphone enclosure 152, into the cavity 153, and through a port O3 in the package cap 185 and into the rear cavity 187. Advantageously, the cantilevered sensors 174 in the two-port microphone module 150 exhibit greater compliance and sensitivity (e.g., exhibit larger deflection for same level of sound pressure), reduce low frequency roll-off, and inhibit high degradation because avoid back volume.

Figure 15:
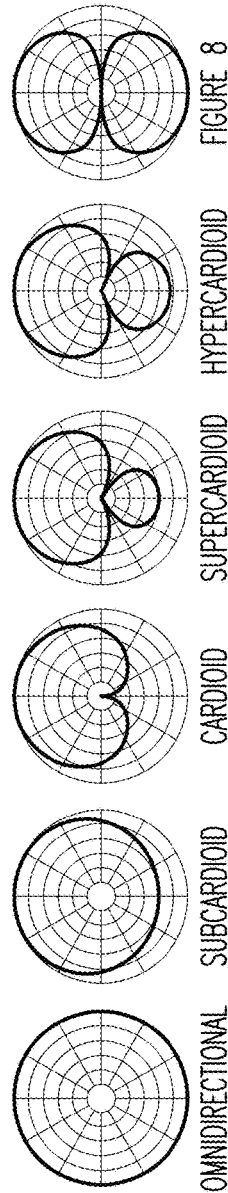
FIG. 15 are schematic views of polar responses for the piezoelectric MEMS microphone of FIG. 14.

FIG. 15 shows different polar responses that can be achieved based on different designs of the microphone module 150 (e.g., based on the design of the enclosure, such as acoustic resistance along the travel path, rear capsule volume and rear sound port dimensions, to achieve desired directionality for frequencies of interest).

The cantilevered sensors described herein (e.g., cantilevered sensors 14A-14M shown in FIGS. 2A-4) for piezoelectric MEMS microphones advantageously provide increased performance (e.g., increased output energy) for the same device area as conventional cantilevered sensors. Alternatively, the cantilevered sensors described herein (e.g., cantilevered sensors 14A-14M shown in FIGS. 2A-4) for piezoelectric MEMS microphones advantageously provide the same performance (e.g., output energy) as conventional cantilevered sensors in a smaller device area, allowing for the reduction in size of the piezoelectric MEMS microphone.

Figure 16:
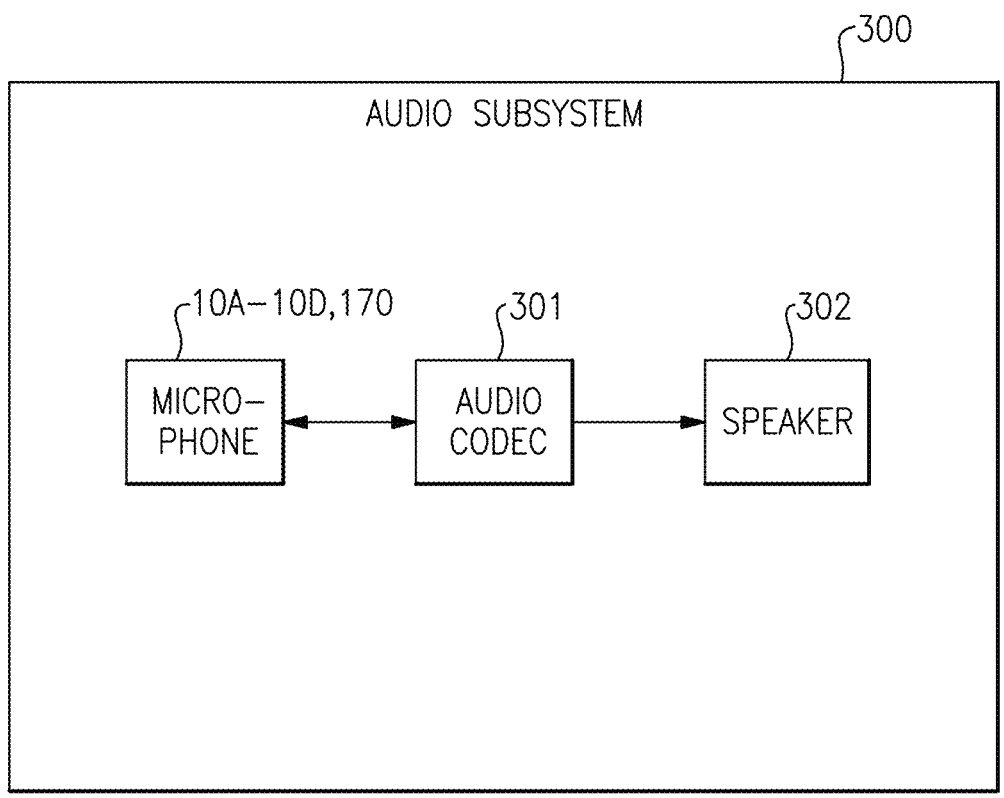
FIG. 16 is a schematic diagram of an audio subsystem.

FIG. 16 is a schematic diagram of an audio subsystem 300. The audio subsystem 300 can include one or more microphones 10A, 10B, 10C, 10D, 170. In one implementation, at least one of the microphone(s) 10A, 10B, 10C, 10D, 170 is a piezoelectric MEMS microphone. The microphone(s) 10A, 10B, 10C, 10D, 170 can communicate with an audio codec 301, which can control the operation of the microphone(s) 10A, 10B, 10C, 10D, 170. The audio codec 301 can also communicate with a speaker 302 and control the operation of the speaker 302.

Figure 17A:
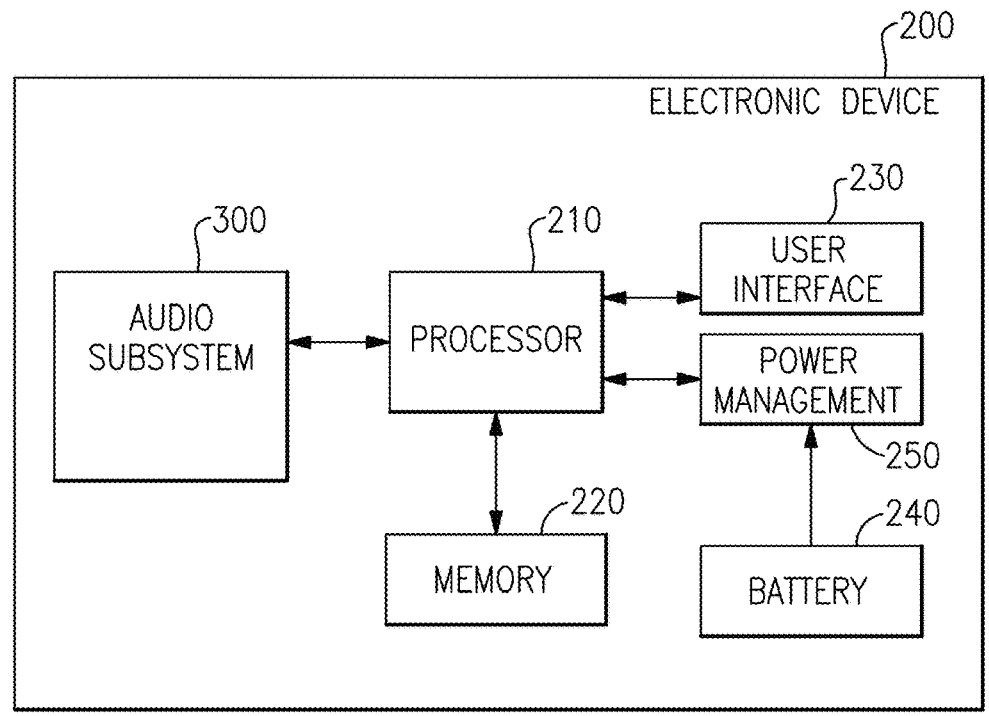
FIG. 17A is a schematic diagram of an electronic device.

FIG. 17A is a schematic diagram of an electronic device 200 that includes the audio subsystem 300. The electronic device 200 can optionally have one or more of a processor 210, a memory 220, a user interface 230, a battery 240 (e.g., direct current (DC) battery) and a power management module 250. Other additional components, such a display and keyboard can optionally be connected to the processor 210. The battery 240 can provide power to the electronic device 200.

It should be noted that, for simplicity, only certain components of the electronic device 200 are illustrated herein. The control signals provided by the processor 210 control the various components within the electronic device 200.

The processor 210 communicates with the user interface 230 to facilitate processing of various user input and output (I/O), such as voice and data. As shown in FIG. 17A, the processor 210 communicates with the memory 220 to facilitate operation of the electronic device 200.

The memory 220 can be used for a wide variety of purposes, such as storing data and/or instructions to facilitate the operation of the electronic device 200 and/or to provide storage of user information.

The power management system or module 250 provides a number of power management functions of the electronic device 200. In certain implementations, the power management system 250 includes a PA supply control circuit that controls the supply voltages of power amplifiers. For example, the power management system 250 can change the supply voltage(s) provided to one or more power amplifiers to improve efficiency.

As shown in FIG. 17A, the power management system 250 receives a battery voltage from the battery 240. The battery 240 can be any suitable battery for use in the electronic device 200, including, for example, a lithium-ion battery.

Figure 17B:
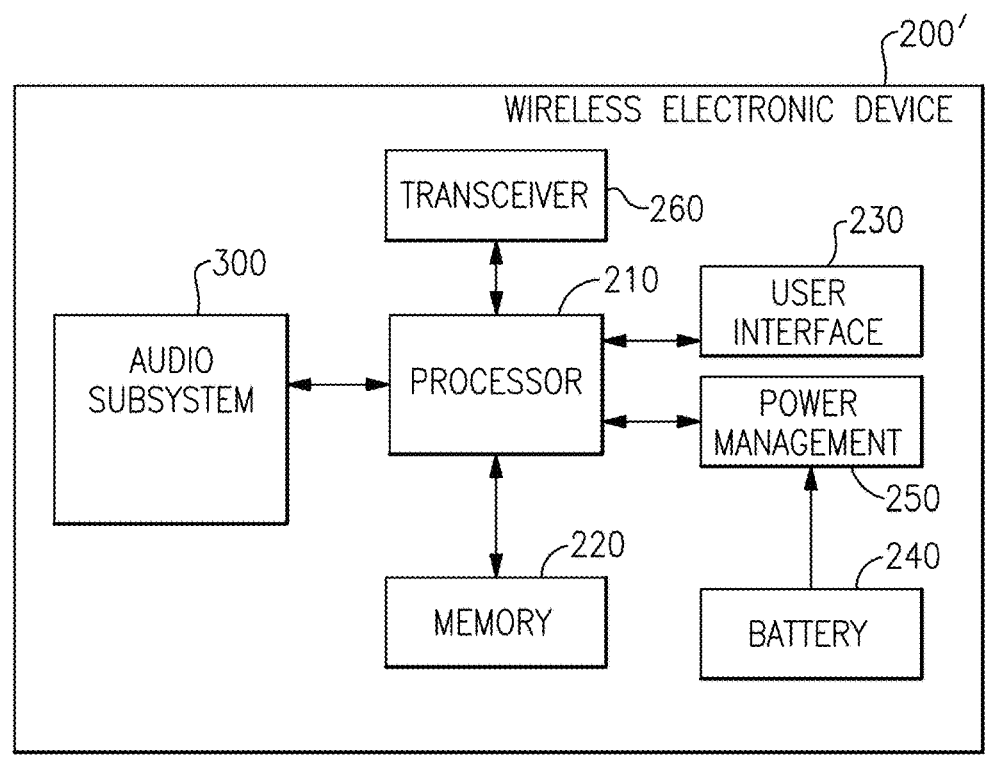
FIG. 17B is a schematic diagram of a wireless electronic device.

FIG. 17B is a schematic diagram of a wireless electronic device 200' The wireless electronic device 200' is similar to the electronic device 200 in FIG. 17A. Thus, reference numerals used to designate the various components of the wireless electronic device 200' are identical to those used for identifying the corresponding components of the electronic device 200 in FIG. 17A. Therefore, the structure and description above for the various features of the electronic device 200 in FIG. 17A are understood to also apply to the corresponding features of the wireless electronic device 200' in FIG. 17B, except as described below.

The wireless electronic device 200' differs from the electronic device 200 in that it also includes a transceiver 260 that communicates (e.g., two-way communication) with the processor 210. Signals, data and/or information received (e.g., wirelessly) by the transceiver 260 (e.g., from a remote electronic device, such a smartphone, tablet computer, etc.) is communicated to the processor 210, and signals, data and/or information provided by the processor is communicated (e.g., wirelessly) by the transceiver 260 (e.g., to a remote electronic device). Further, the function of the transceiver 260 can be integrated into separate transmitter and receiver components.

The wireless electronic device 200' can be used to communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 260 generates RF signals for transmission and processes incoming RF signals received from antennas. It will be understood that various functionalities associated with the transmission and receiving of RF signals can be achieved by one or more components that are collectively represented in FIG. 17B as the transceiver 260. In one example, separate components (for instance, separate circuits or dies) can be provided for handling certain types of RF signals.

The processor 210 provides the transceiver 260 with digital representations of transmit signals, which the transceiver 260 processes to generate RF signals for transmission. The processor 210 also processes digital representations of received signals provided by the transceiver 260.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

Of course, the foregoing description is that of certain features, aspects and advantages of the present invention, to which various changes and modifications can be made without departing from the spirit and scope of the present invention. Moreover, the devices described herein need not feature all of the objects, advantages, features and aspects discussed above. Thus, for example, those of skill in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. It is contemplated that various combinations or subcombinations of these specific features and aspects of embodiments may be made and still fall within the scope of the invention. Accordingly, it should be understood that various features and aspects of the disclosed embodiments can be combined with or substituted for one another in order to form varying modes of the discussed devices.

What is claimed is:

1. A method of making a piezoelectric sensor for a piezoelectric microelectromechanical systems microphone, comprising:
    forming or depositing one or more piezoelectric layers to define a beam extending between a proximal portion and a distal tip, the beam having a width in plan view that is greater at a location distal of the proximal portion than at the proximal portion; and
    attaching the beam to a substrate in cantilever form so that the proximal portion of the beam is anchored to the substrate and the distal tip is a free unsupported end of the beam.

2. The method of claim 1 wherein the one or more layers of piezoelectric material are formed or deposited so that the width of the beam is greater at the distal tip than at the proximal portion.

3. The method of claim 1 wherein the one or more layers of piezoelectric material are formed or deposited so that at least one side edge of the beam extends linearly between the proximal portion and the distal tip.

4. The method of claim 3 wherein the one or more layers of piezoelectric material are formed or deposited so that opposite side edges of the cantilever beam extend linearly between the proximal portion and the distal tip.

5. The method of claim 1 wherein the one or more layers of piezoelectric material are formed or deposited so that the beam is symmetrical about a centerline of the beam.

6. The method of claim 1 wherein the one or more layers of piezoelectric material are formed or deposited so that the distal tip is linear.

7. The method of claim 1 wherein the one or more layers of piezoelectric material are formed or deposited so that the beam has a trapezoidal shape.

8. The method of claim 1 further comprising forming or applying one or more electrodes to the proximal portion of the beam.

9. A method of making a microphone module, comprising:
    forming or providing a printed circuit board that includes a substrate layer;
    forming or providing a piezoelectric microelectromechanical systems microphone via a process comprising
        (a) forming one or more cantilever piezoelectric sensors including forming or depositing one or more piezoelectric layers to define a beam extending between a proximal portion and a distal tip, the beam having a width in plan view that is greater at a location distal of the proximal portion than at the proximal portion, and
        (b) attaching the beam to a substrate in cantilever form so that the proximal portion of the beam is anchored to the substrate and the distal tip is a free unsupported end of the beam; and
    mounting the one or more piezoelectric microelectromechanical systems microphones on the printed circuit board.

10. The method of claim 9 wherein the one or more layers of piezoelectric material are formed or deposited so that the width of the beam is greater at the distal tip than at the proximal portion.

11. The method of claim 9 wherein the one or more layers of piezoelectric material are formed or deposited so that at least one side edge of the beam extends linearly between the proximal portion and the distal tip.

12. The method of claim 11 wherein the one or more layers of piezoelectric material are formed or deposited so that opposite side edges of the cantilever beam extend linearly between the proximal portion and the distal tip.

13. The method of claim 9 wherein the one or more layers of piezoelectric material are formed or deposited so that the beam is symmetrical about a centerline of the beam.

14. The method of claim 9 wherein the one or more layers of piezoelectric material are formed or deposited so that the distal tip is linear.

15. The method of claim 9 wherein the one or more layers of piezoelectric material are formed or deposited so that the beam has a trapezoidal shape.

16. The method of claim 9 further comprising forming or applying one or more electrodes to the proximal portion of the beam.

17. The method of claim 9 wherein the microphone module is a two-port module.

18. The method of claim 9 wherein forming or providing a piezoelectric microelectromechanical systems microphone includes forming a plurality of cantilever piezoelectric sensors and arranging the plurality of cantilever piezoelectric sensors in multiple pairs, at least one of the pairs having their corresponding distal tips oriented toward each other.

19. The method of claim 18 wherein at least one of the pairs has their corresponding distal tips oriented away from each other.

20. The method of claim 9 wherein forming or providing a piezoelectric microelectromechanical systems microphone includes forming a plurality of cantilever piezoelectric sensors and arranging the plurality of cantilever piezoelectric sensors in a circle such that the proximal portions of the cantilever piezoelectric sensors generally define a first circle and the distal tips of the cantilever piezoelectric sensors generally define a second circle that is larger in size than the first circle.

* * * * *

UNITED STATES PATENT AND TRADEMARK OFFICE
CERTIFICATE OF CORRECTION

| | |
|---|---|
| PATENT NO. | : 12,219,333 B2 |
| APPLICATION NO. | : 17/664023 |
| DATED | : February 4, 2025 |
| INVENTOR(S) | : Guofeng Chen et al. |

Page 1 of 1

It is certified that error appears in the above-identified patent and that said Letters Patent is hereby corrected as shown below:

In the Drawings

Sheet 8 of 13, FIG. 10, Line no. 1 (Approx.) (Y-Axis), replace "BANDWWIDTH [kHz]" with "BANDWIDTH [kHz]".

Signed and Sealed this
Twenty-ninth Day of April, 2025

Coke Morgan Stewart
*Acting Director of the United States Patent and Trademark Office*